(12) United States Patent
Shiimoto et al.

(10) Patent No.: US 7,002,838 B2
(45) Date of Patent: Feb. 21, 2006

(54) SEMICONDUCTOR STORAGE DEVICE

(75) Inventors: Tsunenori Shiimoto, Kanagawa (JP); Masaaki Hara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/914,084

(22) Filed: Aug. 10, 2004

(65) Prior Publication Data
US 2005/0047203 A1 Mar. 3, 2005

(30) Foreign Application Priority Data
Aug. 29, 2003 (JP) .............................. 2003-306358

(51) Int. Cl.
*G11C 11/00* (2006.01)
(52) U.S. Cl. ...................... 365/158; 365/148; 365/163; 365/171
(58) Field of Classification Search ..................... None
See application file for complete search history.

(56) References Cited

U.S. PATENT DOCUMENTS 6,567,297 B1 * 5/2003 Baker .......................... 365/148
6,885,579 B1 * 4/2005 Sakimura et al. ........... 365/158

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor storage device has an array of memories, which store data and which are arranged in a matrix, and can read the data in response to address designation. The semiconductor storage device includes word line pairs, bit line pairs, and resistance portions. The resistance portions are each connected across two word lines of the corresponding word line pair and two bit lines of the corresponding bit line at the corresponding intersection thereof. Each resistance portion includes resistors having differential values in both the word line direction and the bit line direction. This arrangement allows the semiconductor storage device to read data with accuracy at high speed and allows the semiconductor storage device to be miniaturized at low cost.

8 Claims, 16 Drawing Sheets

SEMICONDUCTOR STORAGE DEVICE

BACKGROUND OF THE INVENTION

1. Field of the Invention

The present invention relates to a semiconductor storage device that is capable of reading data stored in memory elements.

2. Description of the Related Art

Conventionally, as storage devices using semiconductor elements, DRAMs (dynamic random access memories), which have a simple structure but require refreshing, and FeRAMs (ferroelectric random access memories), which include a ferroelectric material and which can be used as nonvolatile memories, have been used.

Moreover, in recent years, semiconductor storage devices, such as MRAMs (magnetic random access memories) that store data according to whether a resistance is large or small, are under intense development.

An example of such a technology is proposed in Non-patent Document 1, "Soshite-subeteno-memori-wa-fukihat-susei-ni-naru (Every memory then becomes nonvolatile)", "Nikkei Electronics", Feb. 12, 2001, No. 789, Nikkei Business Publications Inc., pp.151–177.

With the MRAMs, however, when memory elements are configured with only resistors typified by TMR (tunneling magneto resistive) elements, there is a problem in that it is difficult to detect data due to leakage current. As a result, resistors and transistors must be combined to constitute the memory elements.

SUMMARY OF THE INVENTION

In view of the above-described problem of the known MRAMs, an object of the present invention is to provide a novel and improved semiconductor storage device which allows for high-accuracy and high-speed data reading, which can be miniaturized at low cost, and which has a memory-element configuration that lacks transistors and that uses, mainly, resistance components.

To achieve the foregoing object, one aspect of the present invention provides a semiconductor storage device in which data is stored in memory elements arranged in a matrix and the data is readable by address designation. The semiconductor storage device includes a plurality of word line pairs, a plurality of bit line pairs, and a plurality of resistance portions. The word line pairs, each being configured as two adjacent word lines, are arranged at regular intervals in a row direction. The bit line pairs, each being configured as two adjacent bit lines, are arranged at regular intervals in a column direction so as to intersect the word line pairs. The resistance portions are adapted to serve as the memory elements, and each resistance portion is connected across two word lines of the corresponding word line pair and two bit lines of the corresponding bit line pair in a region where the word line pair and the bit line pair intersect each other. Each resistance portion includes at least one resistor having a resistance corresponding to stored data to define one storage unit. The "one storage unit" herein refers to one-digit amount of information in a predetermined number form including a binary number.

With the configuration of the memory elements arranged in a matrix, data stored in a memory element connected to a word line selected in accordance with address designation can be read via a corresponding bit line. The memory elements in this case are defined by, mainly, resistance components without transistors.

Each resistance portion may include four resistors that are provided across the corresponding intersections of the two word lines of the word line pair and the two bit lines of the bit line pair. One end of each resistor is connected to the corresponding word line and the other end of the resistor is connected to the corresponding bit line. The data stored in the resistance portion may be determined in accordance with combinations of resistances of the four resistors.

With the four-resistor configuration, it is possible to provide a large amount of information compared to the amount of information obtained with a single-resistance configuration. For example, when each resistor has two resistances, the memory element in the above-described configuration can provide an information amount of $2^4$, i.e., 16.

Of the four resistors at the intersections of the two word lines and the two bit lines, resistances of two resistors provided at diagonal intersections may be substantially equal to each other and resistances of two resistors connected to the same word line may be different from each other.

The four-resistor configuration provides two sets of different resistances and data can be determined in accordance with the resistances of the two sets. The two sets of the resistors can provide two cases, i.e., a case in which either one of the sets has a higher resistance than the other set and a case in which either one set has a lower resistance than the other set. In this case, when a voltage is applied between two word lines of each word line pair, and the value of current flowing between two bit lines of the corresponding bit line pair can be measured to determine data, based on the direction of the current, i.e., based on only whether or the current is positive or negative.

In this case, when data stored are the same, the current is determined to be either a positive or negative value, but the absolute value of the current does not become constant due to the influences of, for example, a voltage drop due to data wiring and current leakage from other adjacent resistance portions.

The resistances of the four resistors may have predetermined two values, which produce two states for the four resistors. The two states may be associated with a pair of data 0 and data 1.

With this arrangement, the resistance takes on only two values, and the two states resulting therefrom allows easy binary determination based on positive and negative currents as described above. With this arrangement, even when the two states are switched over, the states of other adjacent resistance portions are not affected. Thus, when the state of other resistance portion is switched over, for example, even when the data of other resistance portion is switched from data "0" to data "1", the state of the resistance portion of interest is not affected. Accordingly, the state of one resistance portion is independent from the states of other resistance portions, so that current measured for data determination becomes constant. As a result, in addition to the determination of positive and negative values (the determination criteria is "zero ampere"), a determination can be made based on a predetermined current between two constant currents produced from two states. In this manner, this arrangement allows high-accuracy and stable determination.

Upon application of a voltage or current across the two word lines of the word line pair in response to the address designation, the data may be read according to whether current flowing between the two bit lines of the bit line pair or a voltage across the two bit lines of the bit line pair is positive or negative.

With the four-resistor configuration, there is no need to have a configuration in which data is determined by comparing a measured current with a predetermined reference value other than zero ampere, thus allowing high-speed data reading. With the configuration for determining whether or not the voltage is positive or negative, data can be determined without causing current to flow current between bit lines.

The resistance portions are provided in the matrix in at least one storage layer, and the storage layer and a peripheral circuit layer, which includes peripheral circuits for controlling the storage layer, are provided as a multilayer structure.

Further, since the memory-element configuration according to the present invention does not require transistors, there is no need to provide memory elements in the semiconductor layer including the peripheral circuits. Thus, the storage layer can be overlaid on the peripheral-circuit layer such that a multilayer structure is provided. In addition, configuring the storage layer with multiple layers allows the present invention to be applied to a large-capacity storage device. As described above, it is possible to provide a low-cost, compact semiconductor storage device.

The resistance portions may have two ferromagnetic layers and an insulating layer sandwiched therebetween and may include tunneling magneto resistive elements. The tunneling magneto resistive elements have a small resistance when magnetization directions of the two ferromagnetic layers are substantially parallel to each other and have a large resistance when magnetization directions of the two ferromagnetic layers are not parallel to each other. The TMR elements may serve as resistors that vary in resistance between the ferromagnetic layers in accordance with a change in the magnetization direction of the two ferromagnetic layers. The magnetization direction may be controlled in accordance with current flowing through control lines including the word line pairs and the bit line pairs.

As described above, according to the present invention, a memory array can be configured with memory elements that do not have transistors and that use mainly, resistance components. With this arrangement, data can be read at high speed and a compact semiconductor storage device can be provided at low cost.

DESCRIPTION OF THE PREFERRED EMBODIMENTS

Figure 1:
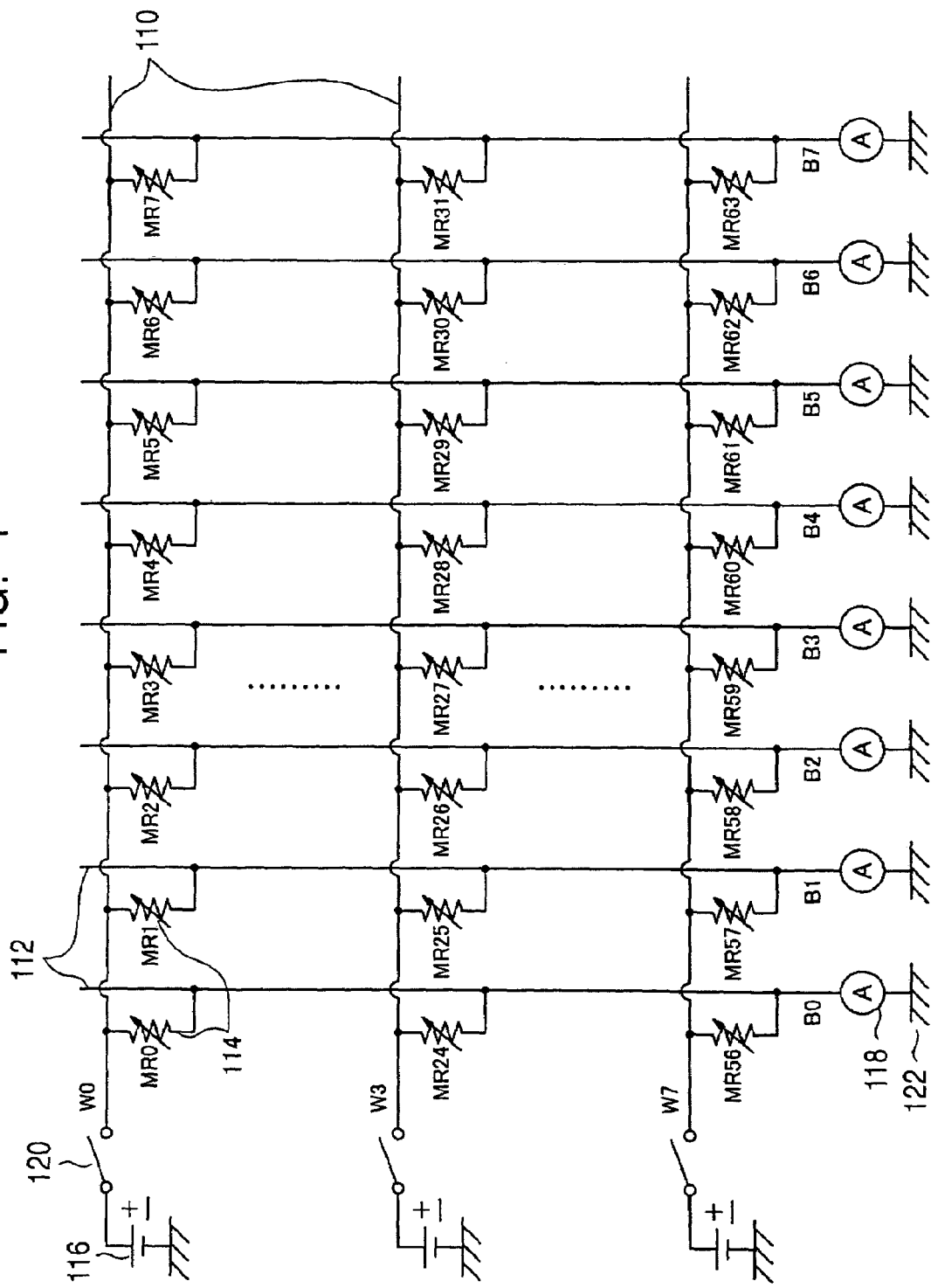
FIG. 1 is a circuit diagram of a semiconductor storage device according to a first embodiment.

Embodiments of the present invention will now be described in detail with reference to the accompanying drawings. In the specification and the drawings, elements having substantially the same functional configuration are denoted with the same reference numeral and the description thereof is omitted.

First Embodiment

A first embodiment that provides a basis for understanding of the present invention will now be described.

FIG. 1 is a circuit diagram of a semiconductor storage device having a memory element configuration that lacks transistors and that uses, mainly, resistance components. In this case, each memory element, which defines one storage unit in a memory array arranged in a matrix, is constituted by one resistor. A semiconductor storage device having such a configuration is referred to as a "simple-matrix semiconductor storage device".

The semiconductor storage device of this embodiment is designed to have a memory array of 8×8=64 bits. Specifically, the semiconductor storage device includes eight word-lines (W0 to W7) 110, eight bit-lines (B0 to B7) 112, 64 resistors (MR0 to MR63) 114, eight power supplies 116, eight ammeters 118, and eight switches 120.

The word lines 110 are arranged at regular intervals in the row direction. The bit lines 112 are arranged at regular intervals in the column direction so as to intersect the word lines 110. At the intersections of the word lines 110 and the bit lines 112, memory elements, each defining one storage unit, are provided.

The resistors 114 serve as the memory elements and are provided across the corresponding intersections of the word lines 110 and the bit lines 112 such that one end of each resistor 114 is connected to the corresponding word line 110 and the other end is connected to the corresponding bit line 112. The word lines 110, the bit lines 112, and the resistors 114 constitute the memory array.

The power supplies 116 are provided to apply a predetermined voltage to the corresponding word lines 110. When an address is designated in order to read data from one of the memory elements, the corresponding switch 120, provided between the power supply 116 and the word line 110 that is selected in accordance with the address designation, is turned on, so that the voltage is applied to the word line 110.

One end of each ammeter 118 is connected to the corresponding bit line 112 and the other end is connected to ground 122. The ammeter 118 measures electrical current flowing from the word line 110, to which that voltage has been applied, to the bit line 112 via the corresponding resistor 114. At this point, the resistor 114 has a resistance corresponding to stored data, so that the ammeter 118 can also obtain an electrical current corresponding to the data. With this arrangement, data stored in each memory element can be determined. In practice, however, each word line 110 and each bit line 112 has a resistance component due to a line resistance. In the today's configuration having large-sized memory capacities, the resistance component due to such a line resistance is not ignorable.

For example, referring to FIG. 1, the electrical current path from the power supply 116 that is connected to the eighth word line W7 to the ammeter 118 that is connected to the first bit line B0 is short. In contrast, the electrical current path from the power supply 116 that is connected to the first word line W0 to the ammeter 118 that is connected to the eighth bit line B7 is long. As a result, due to differences in line resistances of the word lines 110 and the bit lines 112 which are connected to the corresponding memory elements, electrical currents measured by the individual ammeters 118 vary even when the same voltage is applied to the word lines 110.

Such line resistances cause other adjoining resistors 114 to generate leakage current. Due to the influence of the leakage current, a measured current voltage does not become constant.

Figure 2:
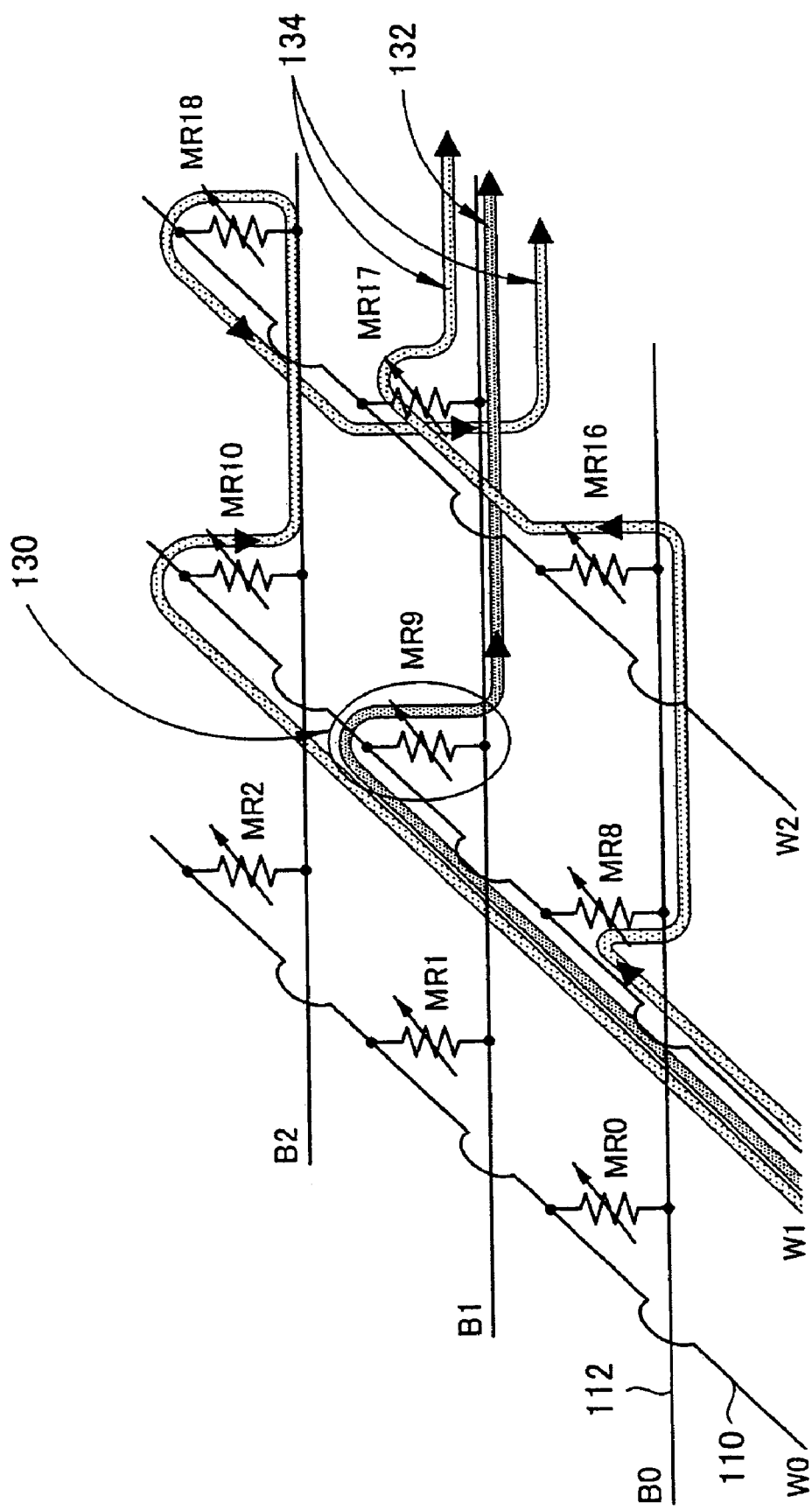
FIG. 2 is a circuit diagram for illustrating leakage current in a memory array in the first embodiment.

FIG. 2 is a circuit diagram for illustrating leakage current in the memory array in the first embodiment. In FIG. 2, the memory array configuration is expressed in a three-dimensional resistance grid.

A case in which data is read from a memory element 130 in the memory array will now be discussed. In this case, a voltage is applied to the second word line W1, and current that is flowing through a real current path 132, which is defined by the memory element 130 and the second bit line B1, is determined. However, due to the line resistances provided by the word lines 110 and the bit lines 112, unwanted current, which flows through current paths 134 other than the real current path 132, is added to the current in the real current path 132. Thus, current that is measured does not indicate an ideal value.

Unwanted current passing through such other current paths 134 varies depending upon the resistances of memory elements other than the memory element 130. Thus, current that is measured does not only indicate an ideal value, but also has a certain degree of variation depending upon other resistances. To what degree a voltage drop due to such leakage current and data wiring has an influence will now be discussed.

In this case, simulation is performed using the configuration shown in FIG. 1. Referring back to FIG. 1, a predetermined voltage (DC 1V in this simulation) is applied to a target word line 110, and the other word lines 110 are set to be open. In this case, the resistance of the resistors 114 only takes on two values, namely, data "1" for a small resistance state and data "0" for a large resistance state.

Figure 3:
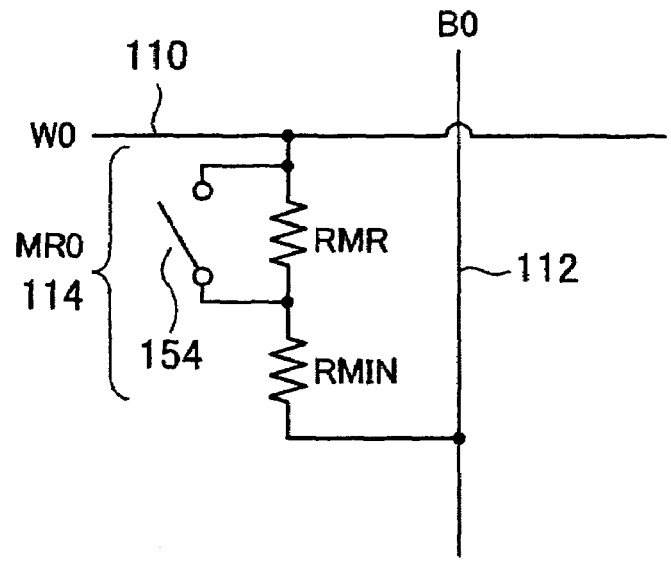
FIG. 3 is a circuit diagram of a model of memory elements.

FIG. 3 is a circuit diagram of a model of a memory element having such two values. For ease of understanding, FIG. 3 shows one memory element having the resistor (MR0) 114 located at the first word line W0 and the first bit line B0. One end of the resistor 114 is connected to the first word line W0 and the other end is connected to the first bit line B0. The resistor 114 is constituted by an additional resistance RMR and a base resistance RMIN. The additional resistance RMR and the base resistance RMIN are connected in series with each other. Further, a switch 154 is connected to two opposite ends of the additional resistance RMR. The switch 154 is turned on and off to generate the binary resistance. Suppose that the additional resistance RMR is 5 kΩ and the base resistance RMIN is 10 kΩ. When the switch 154 is turned on, the binary resistance is 10 kΩ, whereas when the switch 154 is turned off, the binary resistance is 15 kΩ. The former is assumed to be data "1" and the latter is assumed to be data "0".

The resistor 114 can be constituted by TMR (tunneling magneto resistive) elements, and an index indicating the ease of data detection based on the resistance ratio of the TMR elements is called an MR ratio (magneto resistance ratio). In the above configuration, the MR ratio is expressed by:

"Additional resistance RMR"/"Base resistance RMIN"=50%.

A greater MR ratio indicates a greater difference in the binary resistance and thus facilitates detection of electrical current. TMR elements having an MR ratio of 30% to 50% are also available at present.

Figure 4:
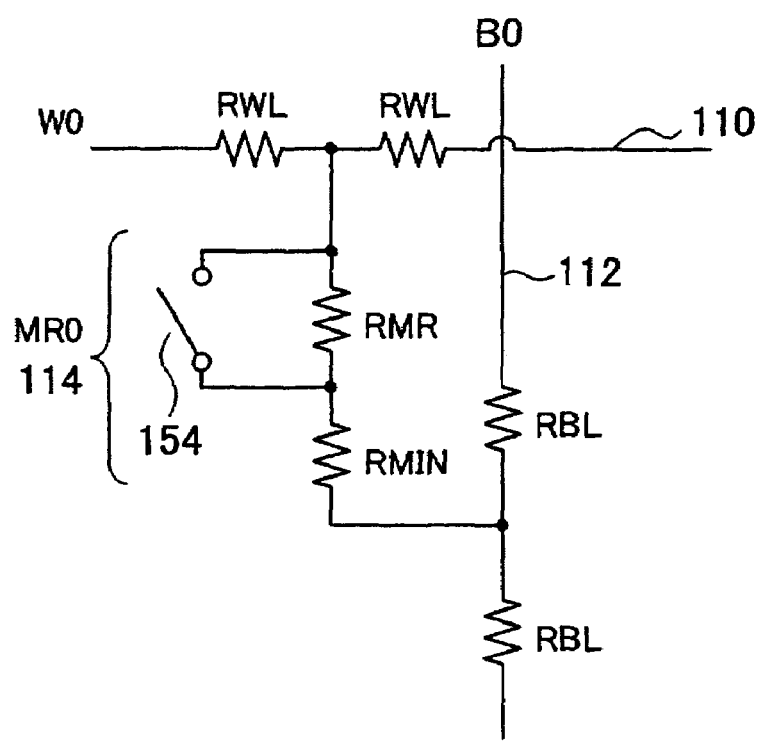
FIG. 4 is a circuit diagram of a model of memory elements.

FIG. 4 is a circuit diagram of a model in which line resistances of the word line 110 and the bit line 112 are added to the memory element shown in FIG. 3.

Referring to FIG. 4, lines resistances along the word line 110 connected to the corresponding resistors 114 of the memory elements that are adjacent to each other in the column direction are referred to as "inter-memory word-line resistors RWL". Referring to FIG. 4, lines resistances along the bit line 112 connected to the corresponding resistors 114 of the memory elements that are adjacent to each other in the row direction are referred to as "inter-memory bit-line resistors RBL". Since the word lines 110 and the bit lines 112 also have line resistances in an actual circuit, such inter-memory word-line resistances RWL and inter-memory bit-line resistances RBL were changed to simulate to what degree current that is measured is affected.

The simple-matrix semiconductor device shown in FIG. 1 has 64-bit memory elements, data of which can express $2^{64}$ states. In the simulation, 64-bit data were generated at random 1000 times, and the individual bit data of the generated data were associated with respective resistances of the memory elements. That is, it was defined that the resistance is 10 kΩ when the bit data of the generated data is "1" and the resistance is 15 kΩ when the bit data of the generated data is "0". In this case, when it is assumed, out of the 64 bit data, one-bit data is 0, two-bit data is 1, and three-bit data is 0, the memory element-resistances, which are associated with the individual bit data, become 15 kΩ, 10 kΩ, and 15 kΩ, respectively. Under this condition, current flowing through the bit line 112 was measured for two cases, i.e., a case in which the first word line W0 was selected and a case in which the eighth word line W7 was selected.

FIGS. 5A to 5F are plot diagrams each showing an eye pattern for an electrical current measured as described above. In each plot diagram, the horizontal axis 210 indicates a measured bit and the vertical axis 212 indicates a measured current. The "eye pattern" herein refers to a visually-expressed ease of data determination of based on a measurement. When the measured electrical currents are plotted for each bit, the electrical currents can be expressed with a large number of points. The points of adjacent bits are connected by a straight line, and each diamond portion defined by the straight lines is regarded as an eye. When the eye defined in this manner is open, it is easy to determine the above-noted two values, whereas when the eye is closed, it is difficult to determine the two values. Such an eye pattern is commonly used for equalizing-characteristic comparison and identification-performance comparison in the digital transmission field.

Figure 5A:
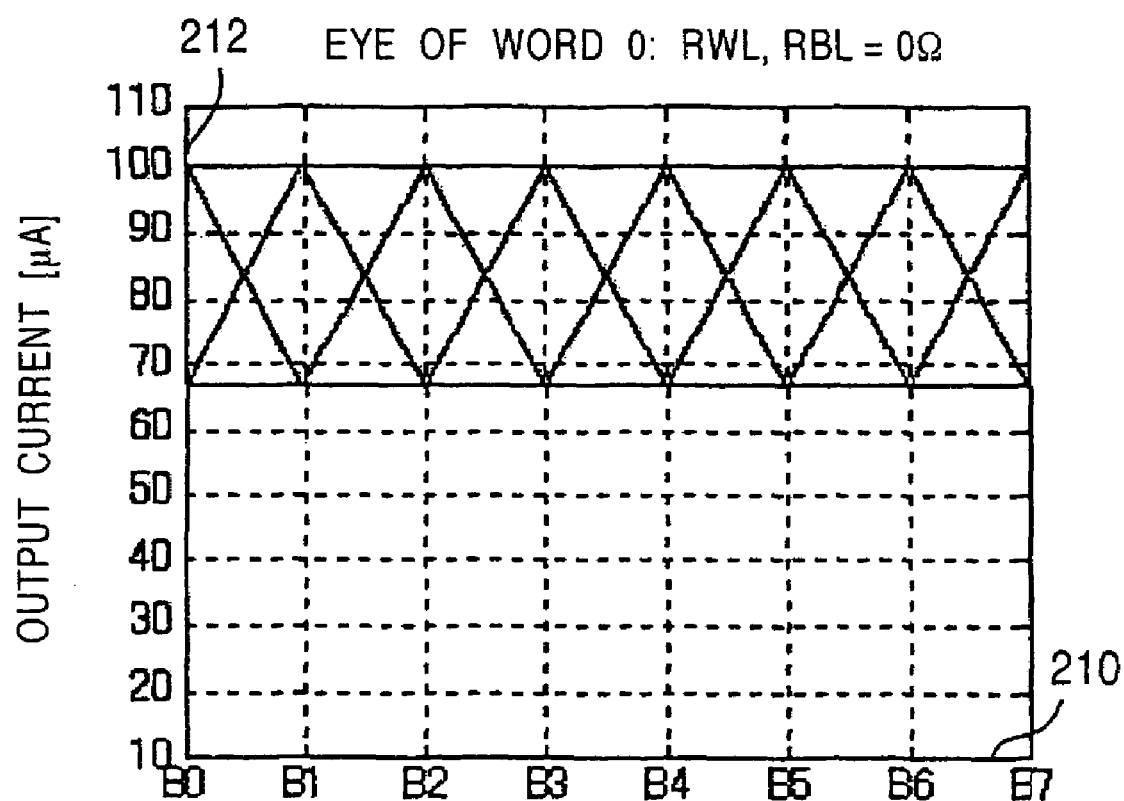
FIG. 5A is a plot diagram showing an eye pattern for an electrical current.
Figure 5B:
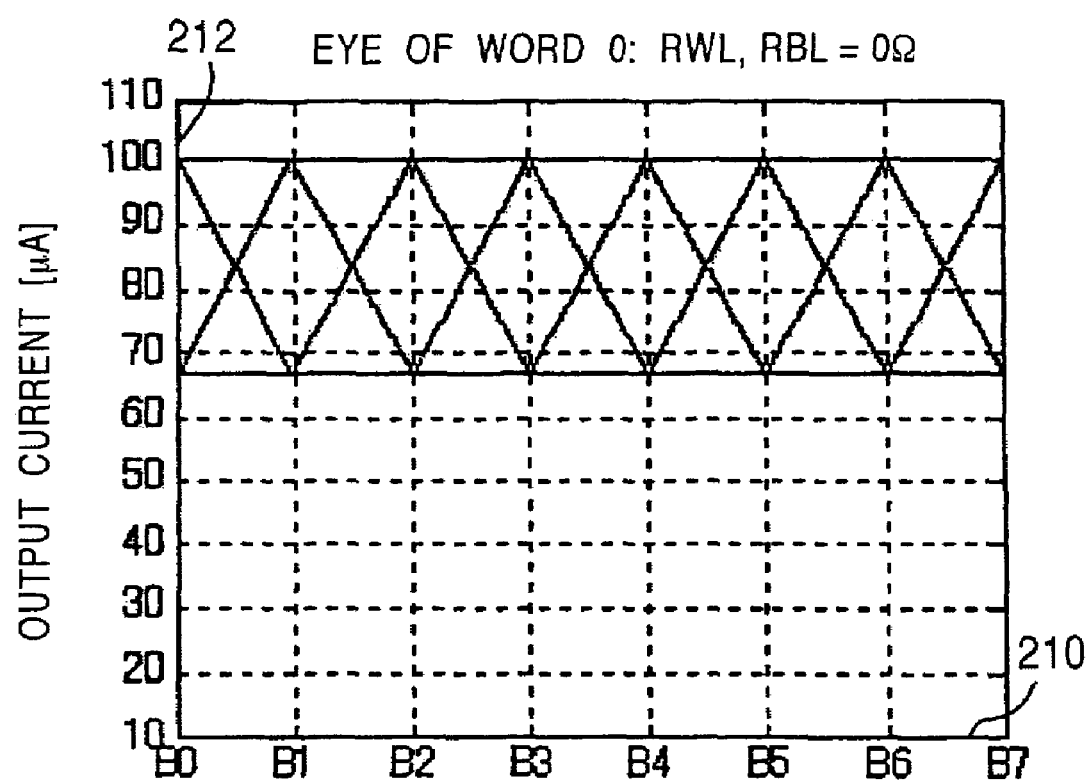
FIG. 5B is a plot diagram showing an eye pattern for an electrical current.

In the configuration of the memory array in the semiconductor storage device described above, it is ideal that the words lines 110 and the bit lines 112 have a line resistance of 0Ω. FIGS. 5A and 5B show a case in which the inter-memory word-line resistances RWL and the inter-memory bit-line resistances RBL are 0Ω, FIG. 5A showing a case in which the first word line W0 is selected and FIG. 5B showing a case in which the eighth word line W7 is selected.

For data "1", the electrical current in this case is 100 µA at 1 V/10 kΩ, and for data "0", the electrical current is 67 µA at 1 V/15 kΩ. In this case, since the above-noted leakage current and the like are not generated, the electrical current can be measured with high accuracy without the influence of the other bit states and also the eye pattern opens. Thus, in FIGS. 5A and 5B, data can be determined in a satisfactory manner.

Figure 5C:
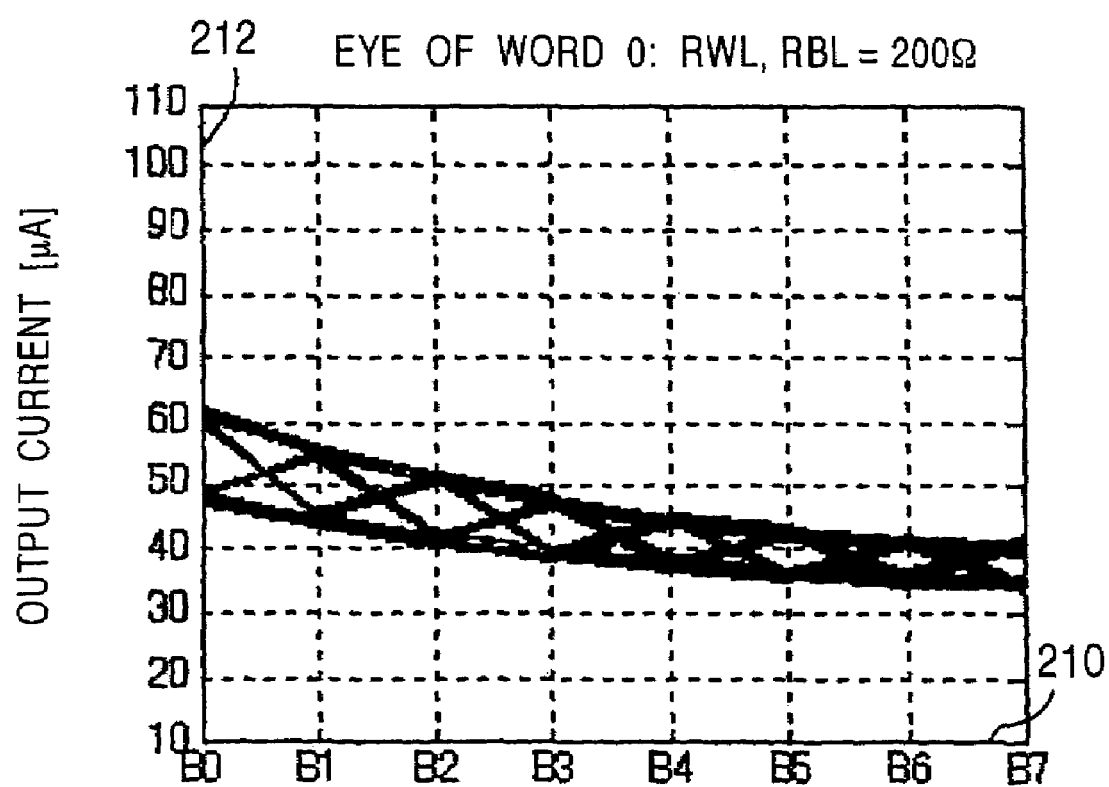
FIG. 5C is a plot diagram showing an eye pattern for an electrical current.
Figure 5D:
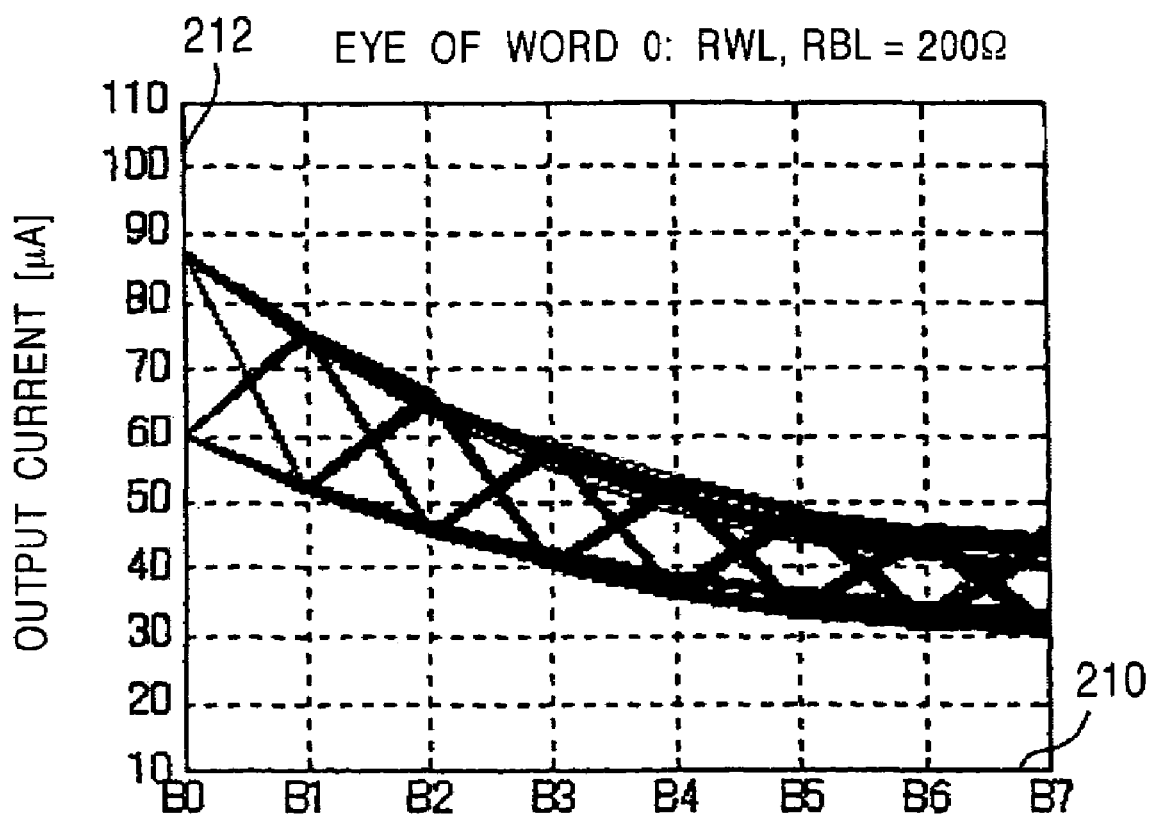
FIG. 5D is a plot diagram showing an eye pattern for an electrical current.

FIGS. 5C and 5D show a case in which the inter-memory word-line resistances RWL and the inter-memory bit-line resistances RBL are 200Ω, FIG. 5C showing a case in which the first word line W0 is selected and FIG. 5D showing a case in which the eighth word line W7 is selected.

In this case, a voltage drop due to the inter-memory word-line resistances RWL and the inter-memory bit-line resistances RBL causes an overall measured electrical current to decrease, thereby closing the eye pattern. Further, the electrical current fluctuates because of the influence of the other bit states. When FIGS. 5C and FIG. 5D are compared, since the first word line W0 has a longer current path than the eighth word line W7, the first word line W0 has a small overall electrical current and also displays a narrow eye pattern. Further, in the same plot, since the bit line B7 has a longer current path than the bit line B0, the bit line B7 displays a narrow eye pattern. The length of each current path can be seen from FIG. 1.

Figure 5E:
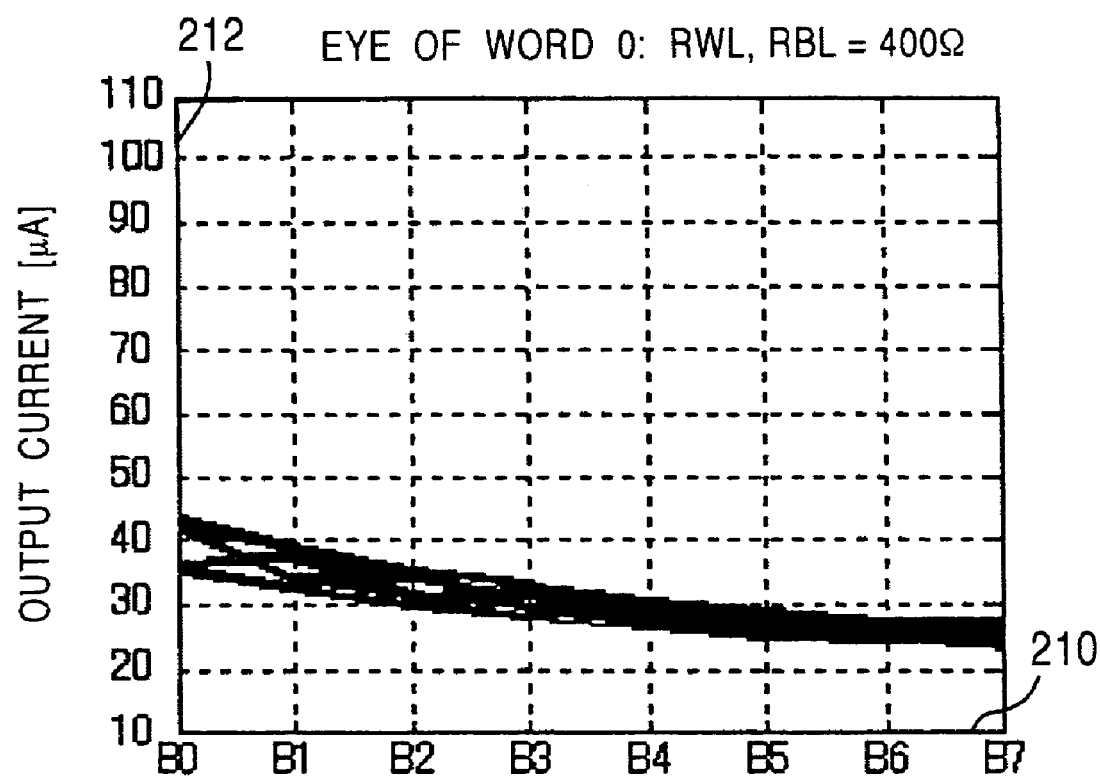
FIG. 5E is a plot diagram showing an eye pattern for an electrical current.
Figure 5F:
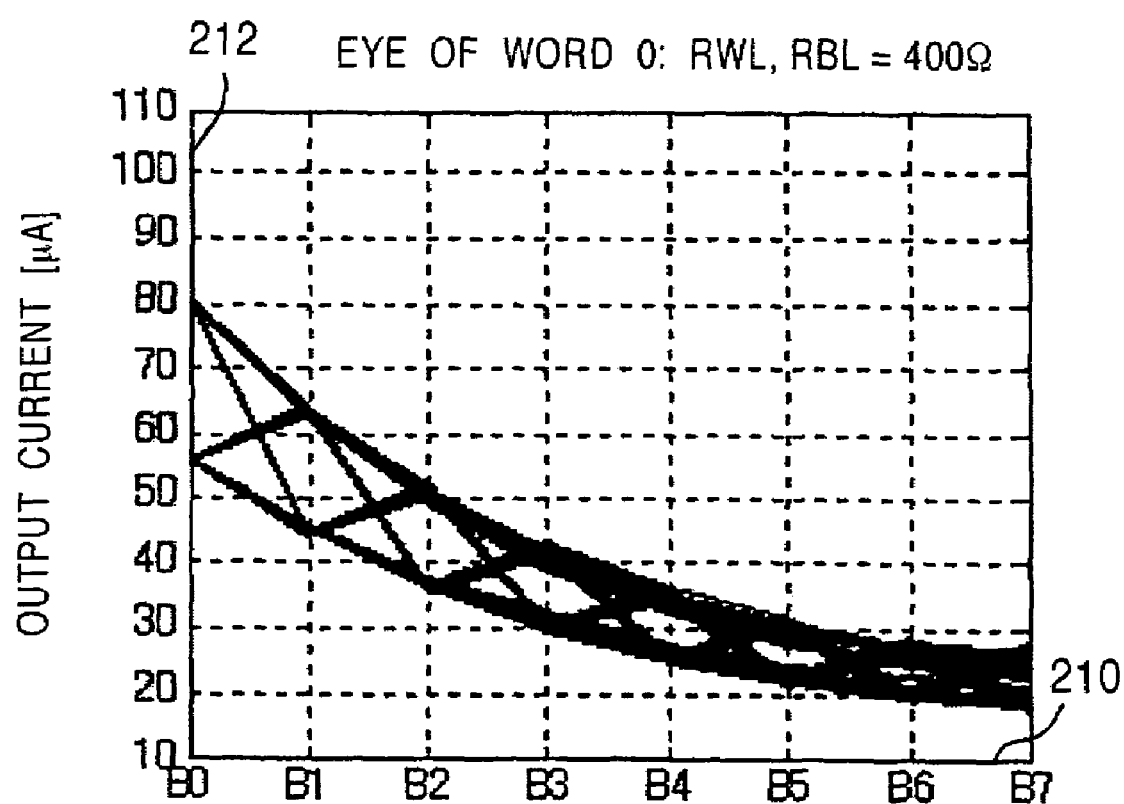
FIG. 5F is a plot diagram showing an eye pattern for an electrical current.

FIGS. 5E and 5F show a case in which the inter-memory word-line resistances RWL and the inter-memory bit-line resistances RBL are 400Ω, FIG. 5E showing a case in which the first word line W0 is selected and FIG. 5F showing a case in which the eighth word line W7 is selected.

In this case, a voltage drop due to the inter-memory word-line resistances RWL and the inter-memory bit-line resistances RBL causes a measured electrical current to decrease more than that in FIGS. 5C and 5C, thereby further closing the eye pattern. The influence of leakage current and the like due to other bit states also increases, thereby causing the current to greatly fluctuate. The comparison between FIG. 5E and FIG. 5F indicates a result that is similar to the that between FIG. 5C and FIG. 5D, but makes it more difficult to distinguish between data "1" and data "0", since the eye patterns are closed in both FIG. 5E and 5F. In particular, in the state shown in FIG. 5E, with respect to the bit lines B5, B6, and B7, which have the longest current paths in the present embodiment, it is no more possible to distinguish data "1" between data "0".

The simulation described above indicates that, the longer the current path between the power supply 116 and the ammeter 118 via the corresponding memory element, the more difficult the opening of the eye pattern becomes, because of a voltage drop due to data wiring and current leakage from other adjacent resistance portions. The influences of the voltage drop and the leakage current can be regarded as inter-bit interference in terms of signal processing. Thus, in the simple-matrix semiconductor storage device that cannot perform electrical isolation, current at the time of reading of a predetermined bit is affected by the interference of all bits.

In the above-described simulation, the inter-memory word-line resistances RWL and the inter-memory bit-line resistances RBL have been set to 200Ω or 400Ω, in order to obtain a noticeable effect. In practice, however, in a 64-bit memory array as described above, a line resistance of 400Ω is generally unlikely. Thus, the above-described problem can be underestimated for a small-capacity semiconductor storage device, but cannot be ignored for a future large-scale semiconductor storage device.

One approach for overcoming the problems caused by a voltage drop due to data wiring and current leakage from other adjacent resistance portions is to constitute the memory elements by connecting transistors to the respective resistors 114. A comparative example for the embodiment of the present invention will briefly be described below.

Comparative Example

Figure 6:
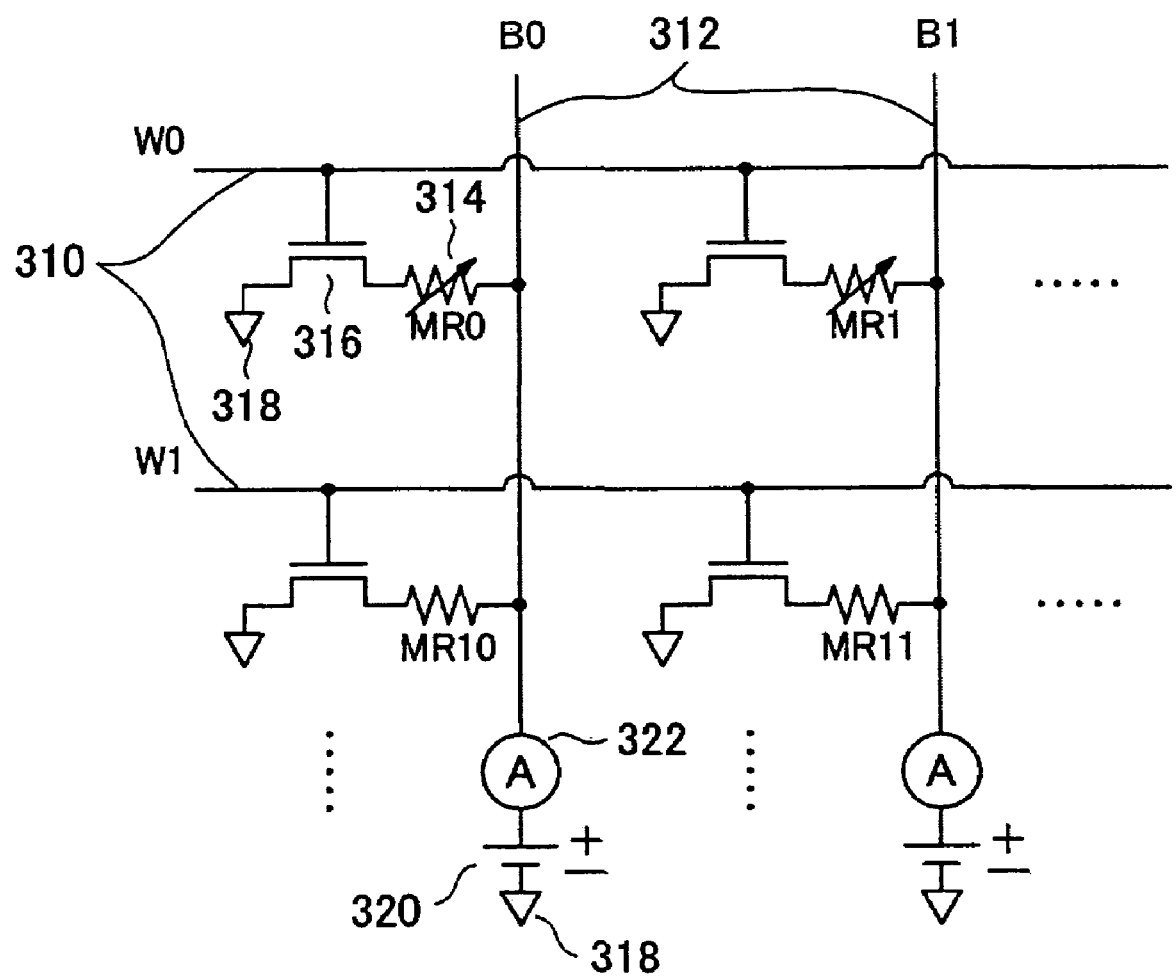
FIG. 6 is circuit diagram of a memory array of a comparative example.

FIG. 6 is a circuit diagram of a memory array constituted by memory elements having transistors. This memory array includes a plurality of word lines 310, a plurality of bit lines 312, a plurality of resistors 314, and a plurality of transistors 316.

The plurality of word lines 310 are arranged at regular intervals in the row direction. The plurality of bit lines 312 are arranged at regular intervals in the column direction so as to intersect the word lines 310. At the intersections of the word lines 310 and the bit lines 312, memory elements, each defining one storage unit, are provided.

One end of each resistor 314 is connected to the drain of the corresponding transistor 316 and the other end of the resistor 314 is connected to the corresponding bit line 312. The base of the transistor 316 is connected to the corresponding word line 310 and the source of the transistor 316 is connected to ground 318. One resistor 314 and one transistor 316 constitute the memory element, which defines one storage unit.

When one word line 310 is selected in the memory array, only the transistor 316 that is connected to the selected word line 310 operates. When a voltage is applied by the power supply 320, the resulting current flows through the ammeter 322, passes through only the resistor 314 connected to the transistor 316, and is fed back through ground 318. In this manner, the transistors 316 can isolate each memory element from other adjacent resistors 314, which allows data to be read with high accuracy in the same manner as in FIGS. 5A and 5B.

Second Embodiment

A semiconductor storage device of a second embodiment has an improved configuration of the first embodiment and allows high-accurate and high-speed data reading, which have been difficult with the configuration of the first embodiment.

Figure 7:
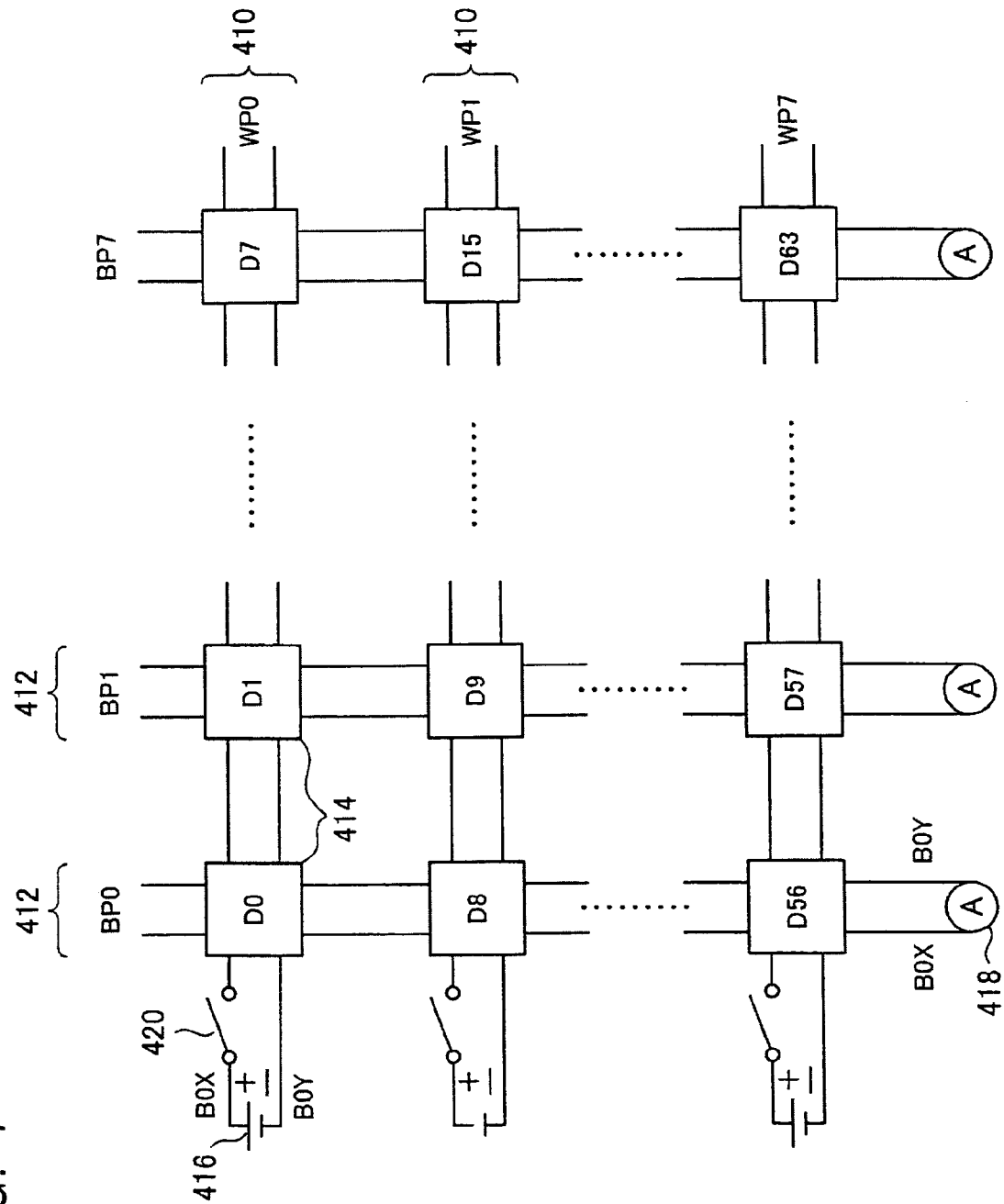
FIG. 7 is a circuit diagram of a semiconductor storage device according to a second embodiment.

FIG. 7 is a circuit diagram of a semiconductor storage device according to a second embodiment. In this case, each memory element, which defines one storage unit in a memory array arranged in a matrix, is constituted by one resistance portion having a plurality of resistors.

The semiconductor storage device of this embodiment is designed to have a memory array of 8×8=64 bits. Specifically, the semiconductor storage device includes eight word-line pairs 410, eight bit-line pairs 412, 64 resistance portions 414, eight power supplies 416, eight ammeters 418, and eight switches 420.

The word line pairs 410 are arranged at regular intervals in the row direction. The bit line pairs 412 are arranged at regular intervals in the column direction so as to intersect the word line pairs 410. At the intersections of the word line pairs 410 and the bit line pairs 412, memory elements, each defining one storage unit, are provided.

Each resistance portion 414 serves as the memory element described above and is constituted by four resistors, which are provided across the corresponding intersections of two word line of each word line pair 410 and two bit line of each bit line pair 412 and are not directly connected with each other. One end of each resistor is connected to one word line of the word line pair 410 and the other end is connected to one bit line of the bit line pair 412. The word line pairs 410, the bit line pairs 412, and the resistors 414 constitute the memory array.

Each power supply 416 is provided to apply a predetermined difference voltage to two word lines of the corresponding word line pair 410. When an address is designated in order to read data from one of the memory elements, the corresponding switch 420, provided between the power supply 416 and the word line pair 410 that is selected in accordance with the address designation, is turned on, so that the voltage is applied-to the word line pair 410.

Each ammeter 418 has two opposite ends that are connected to two bit lines of the corresponding bit line pair 412, and measures current flowing from the word line pair 410, to which that voltage is applied, to the bit line pair 412 via the corresponding resistance portion 414. At this point, since the resistor portion 414 has a resistance corresponding to stored data, the ammeter 418 can also obtain an electrical current corresponding to the data.

Figure 8:
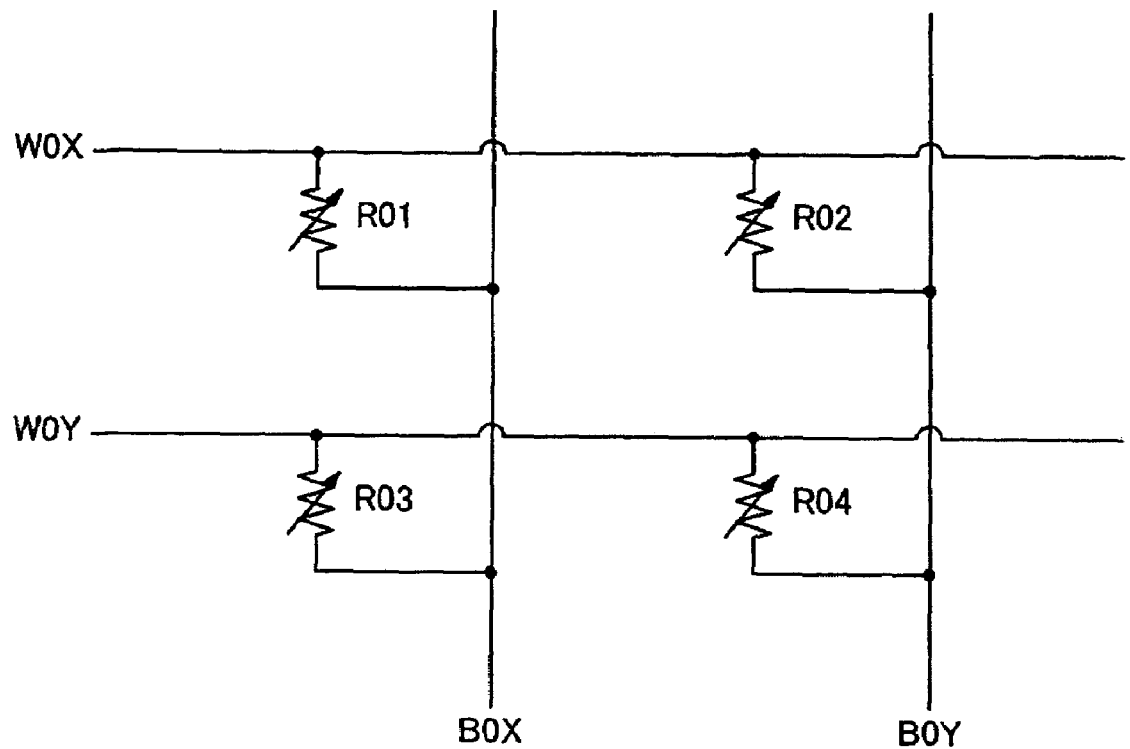
FIG. 8 is a circuit diagram illustrating a resistance portion in the second embodiment.

FIG. 8 is a circuit diagram illustrating the configuration of each resistance portion 414. This circuit configuration can provide one storage unit.

Referring to FIG. 8, each resistance portion 414 includes four resistors R01 to R04. Each word line pair 410 is configured as a first X word line W0X and a first Y word line W0Y and each bit line pair 412 is configured as a first X bit line B0X and a first Y bit line B0Y. The four resistors R1 to R4 are provided across the corresponding intersections of the word lines W0X and W0Y and the bit lines B0X and B0Y such that one end of each resistor is connected to the corresponding word line and the other end is connected to the corresponding bit line. More specifically, one end of the first resistor R01 is connected to the first X word line W0X and the other end is connected to the first X bit line B0X. One end of the second resistor R2 is connected to the first X word line W0X and the other end is connected to the first Y bit line B0Y. One end of the third resistor R03 is connected to the first Y word line W0Y and the other is connected to the first X bit line B0X. One end of the fourth resistor R04 is connected to the first word line W0Y and the other end is connected to the first Y bit line B0Y. These four resistors R01 to R04 are connected via the word line pair 410 and the bit line pair 412, but are not directly connected with each other.

At the resistance portion 414 at the intersections of the two word lines of the word line pair 410 and the two bit lines of the bit line pair 412, the resistances of two resistors provided at the diagonal intersections are substantially equal to each other and the resistances of two resistors connected to the same word line are different from each other. That is, the resistances of the first resistor R01 and the fourth resistor R04 are substantially equal to each other, and the resistances of the second resistor R02 and the third resistor R03 are substantially equal to each other. Further, the resistances of the first resistor R01 and the second resistor R02 are different from each other, and the resistances of the third resistor R03 and the fourth resistor R04 are also different from each other.

Thus, the configuration of the four resistors R01 to R04 provides two sets of different resistances. Specifically, this configuration provides two cases, i.e., a case in which either one of the sets has a higher resistance than the other set and a case in which either one set has a lower resistance than the other set. Examples include a case in which the first resistor R01 has a resistance of 15 kΩ, the second resistor R02 has a resistance of 10 kΩ and a case in which the first resistor R01 has a resistance of 15 kΩ and the second resistor R02 has a resistance of 20 kΩ. These two states are associated with data "1" and data "0" and are expressed in the following matrix form:

$$\text{data ``1''} = \begin{bmatrix} \text{1st resistance} & \text{2nd resistance} \\ \text{3rd resistance} & \text{4th resistance} \end{bmatrix} \quad \text{(Equation 1)}$$

$$= \begin{bmatrix} 15 \text{ k}\Omega & 10 \text{ k}\Omega \\ 10 \text{ k}\Omega & 15 \text{ k}\Omega \end{bmatrix},$$

$$\text{data ``0''} = \begin{bmatrix} \text{1st resistance} & \text{2nd resistance} \\ \text{3rd resistance} & \text{4th resistance} \end{bmatrix}$$

$$= \begin{bmatrix} 15 \text{ k}\Omega & 20 \text{ k}\Omega \\ 20 \text{ k}\Omega & 15 \text{ k}\Omega \end{bmatrix}$$

In the memory array shown in FIG. 7, data determination in which the configuration of the resistances described above was reflected will no be discussed. A voltage was applied across two word lines of the word line pair 410 and current flowing through two bit lines of the bit line pair 412 was measured. For data "1", at the ammeter 418, current flows from the first Y bit line B0Y to the first X bit line B0X, and for data "0", current flows from the first X bit line B0X to the first Y bit line B0Y. Thus, based on the direction of current flowing through the ammeter 418, a determination can be made as to whether the binary data is "1" or "0". With the configuration described above, however, the electrical current is not constant, due to the influence of, for example, current leakage from other adjacent resistance portions.

Setting the resistances of the four resistors in the configuration to predetermined two values allows the value of the above-described current to be constant. In the above example, four resistors are configured so as to take on only two values, e.g., 10 kΩ and 15 kΩ. In this case, a state in which the first resistance is 15 kΩ and the second resistance is 10 kΩ and a state in which the first resistance is 10 kΩ and the second resistance is 15 kΩ are provided. These two states are associated with data "1" and data "0" and are expressed in the following matrix form:

$$\text{data ``1''} = \begin{bmatrix} \text{1st resistance} & \text{2nd resistance} \\ \text{3rd resistance} & \text{4th resistance} \end{bmatrix} \quad \text{(Equation 2)}$$

$$= \begin{bmatrix} 15 \text{ k}\Omega & 10 \text{ k}\Omega \\ 10 \text{ k}\Omega & 15 \text{ k}\Omega \end{bmatrix},$$

$$\text{data ``0''} = \begin{bmatrix} \text{1st resistance} & \text{2nd resistance} \\ \text{3rd resistance} & \text{4th resistance} \end{bmatrix}$$

$$= \begin{bmatrix} 10 \text{ k}\Omega & 15 \text{ k}\Omega \\ 15 \text{ k}\Omega & 10 \text{ k}\Omega \end{bmatrix}$$

This can also be expressed by inverting the association of the data, as follows:

$$\text{data "1"} = \begin{bmatrix} \text{1st resistance} & \text{2nd resistance} \\ \text{3rd resistance} & \text{4th resistance} \end{bmatrix} \quad \text{(Equation 3)}$$
$$= \begin{bmatrix} 10\ k\Omega & 15\ k\Omega \\ 15\ k\Omega & 10\ k\Omega \end{bmatrix},$$

$$\text{data "0"} = \begin{bmatrix} \text{1st resistance} & \text{2nd resistance} \\ \text{3rd resistance} & \text{4th resistance} \end{bmatrix}$$
$$= \begin{bmatrix} 15\ k\Omega & 10\ k\Omega \\ 10\ k\Omega & 15\ k\Omega \end{bmatrix}$$

This can be regarded that a differential configuration is used in both the word-line direction and the bit-line direction.

The above two states make it possible to facilitate binary determination based on positive and negative currents as described above. With this arrangement, even when the two states are switched over, the states of other adjacent resistance portions are not affected. Thus, when the state of other resistance portion is switched over, for example, even when the data of other resistance portion is switched from data "0" to data "1", the state of the resistance portion of interest is not affected. Accordingly, the state of one resistance portion is independent from the states of other resistance portions, so that a current measured for data determination becomes constant. As a result, in addition to the determination of positive and negative values (the determination reference is "zero ampere"), a determination can be made based on a predetermined current between two constant currents produced from two states. In this manner, this arrangement allows high-accuracy and stable determination.

Simulation that was similar to that in the first embodiment was performed using the configuration described above to describe the advantage of the present embodiment.

Figure 9:
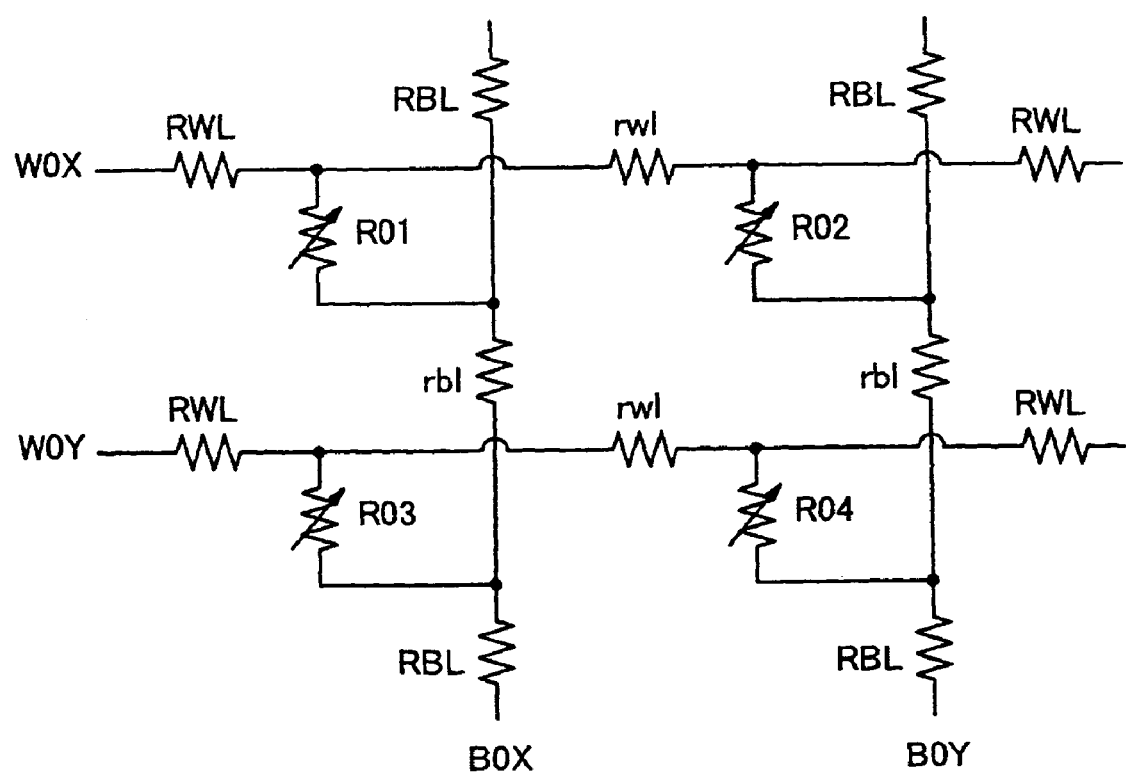
FIG. 9 is a circuit diagram of a model of memory elements.

FIG. 9 is a circuit diagram of a model in which line resistances of the word line pair 410 and the bit line pair 412 are added to the resistance portion shown in FIG. 8.

In FIG. 9, resistances along the word lines between the resistance portions 414 that are adjacent to each other in the column direction are referred to as "inter-memory word line resistances RWL, and resistances along the word lines within the resistance portions 414 are referred to as "intra-memory word line resistances rwl. Further, resistances along the bit lines between the resistance portions 414 that are adjacent to each other in the row direction are referred to as "inter-memory bit line resistances RBL, and resistances along the bit lines within the resistance portions 414 are referred to as "intra-memory bit line resistances rbl. In this case, simulation was performed under a severe condition in which a large-scale memory array was used. That is, in this memory array, the inter-memory word line resistances RWL and the inter-memory bit line resistances RBL were set to 400Ω and the intra-memory word line resistances rwl and the intra-memory bit line resistances rbl were set to 10Ω.

For other conditions, a difference voltage was applied to one word line pair 410 from which reading is performed and other word line pairs 410 were set to be open. For this case, measurement of a current flowing along a bit line may be performed with respect to all bit line pairs 412 at the same time or may be performed with respect to one or more specific bit line pairs 412. In the latter case, bit lines from which reading is not performed may be set to be open.

The semiconductor storage device shown in FIG. 7 has 64-bit memory elements, and in the simulation, 64-bit data were generated at random 1000 times and the individual bit data of the generated data were associated with respective resistances of the memory elements. Thus, the combinations of resistances represented by Equation 2 or 3 were used to express data "1" and data "0".

Figure 10A:
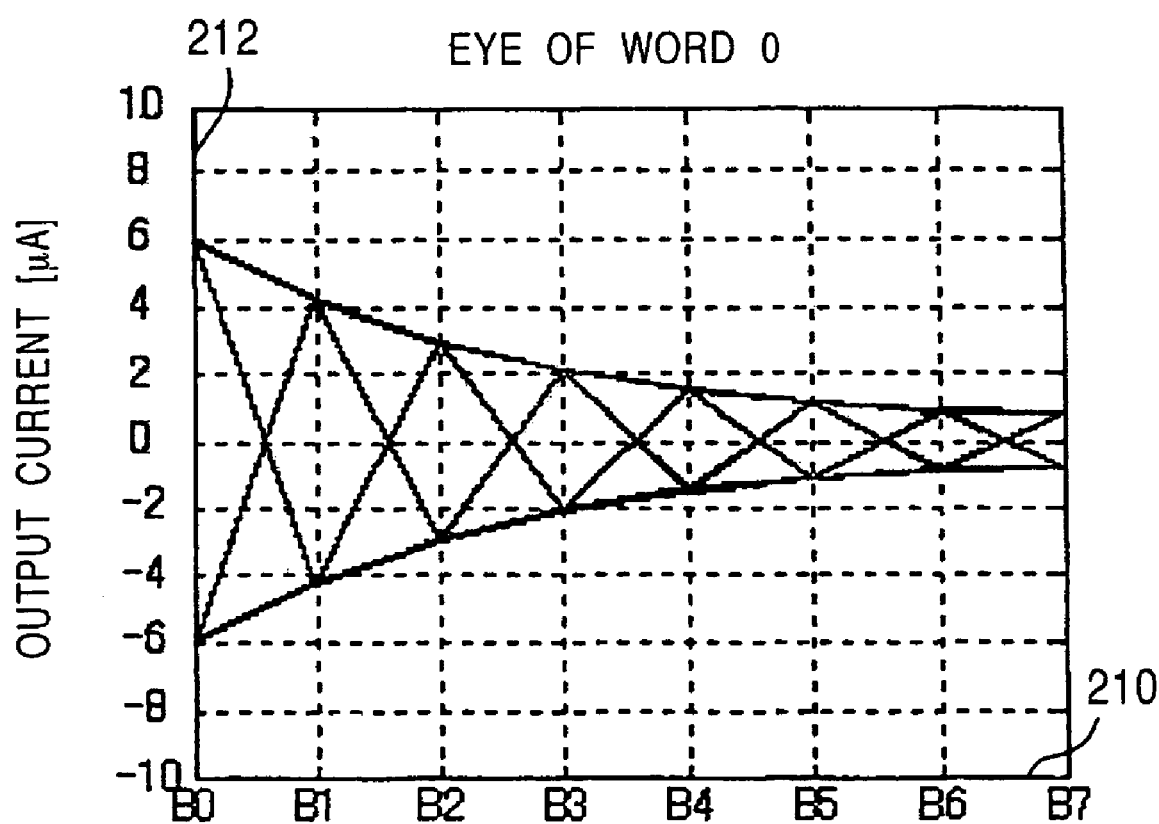
FIG. 10A is a plot diagram showing an eye pattern for an electrical current.
Figure 10B:
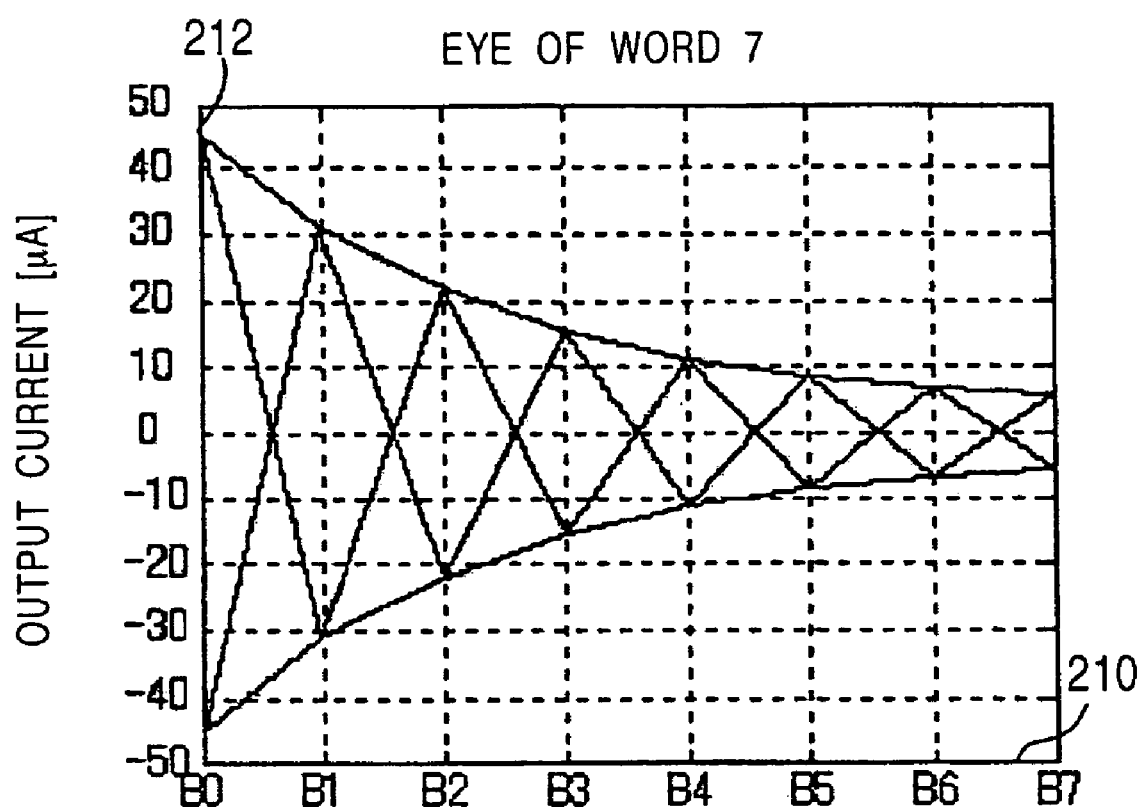
FIG. 10B is a plot diagram showing an eye pattern for an electrical current.

FIGS. 10A and 10B are plot diagrams each showing an eye pattern for an electrical current measured as described above. In these plot diagrams, the horizontal axis 210 indicates a measured bit and the vertical axis 212 indicates a measured current. FIG. 10A shows a case in which the first word line pair WP0 was selected and FIG. 10B shows a case in which the eighth word line pair WP7 was selected.

According to the simulation, the absolute value of an overall electrical current is low and the first word line pair WP0 (FIG. 10A) has a narrower eye pattern than the eighth word line pair WP7 (FIG. 10B). In this respect, this arrangement provides a result similar to that in the first embodiment. However, when compared to the eye patterns shown in FIGS. 5A to 5F, electrical-current points plotted against respective bits are divided into positive and negative values along the border of a zero-ampere current and two points for each bit have substantially equal absolute values. Furthermore, the output current is independent from the states of other resistance portions 414 (and there is no interference between bits) and always displays a constant value.

As a result of such an advantage, a current flowing through bit lines can be assumed to a certain degree during data determination and a data determination reference can be provided independently from the data storage states of other memory elements. Further, even when a current path becomes long due to an increased storage capacity, there is no need to additionally provide a special detection circuit, since it is sufficient to determine only whether the current is positive or negative.

Although the element area of the memory elements in the present embodiment quadruples compared to that of the simple-matrix storage device illustrated in the first embodiment, high-accuracy and high-speed reading is achieved while suppressing the influence of leakage current, which cannot be solved with the simple-matrix storage device.

Third Embodiment

In a third embodiment, the ammeters 418, which are data determining sections of the semiconductor storage device illustrated in the second embodiment, are replaced with other determining sections.

Figure 11:
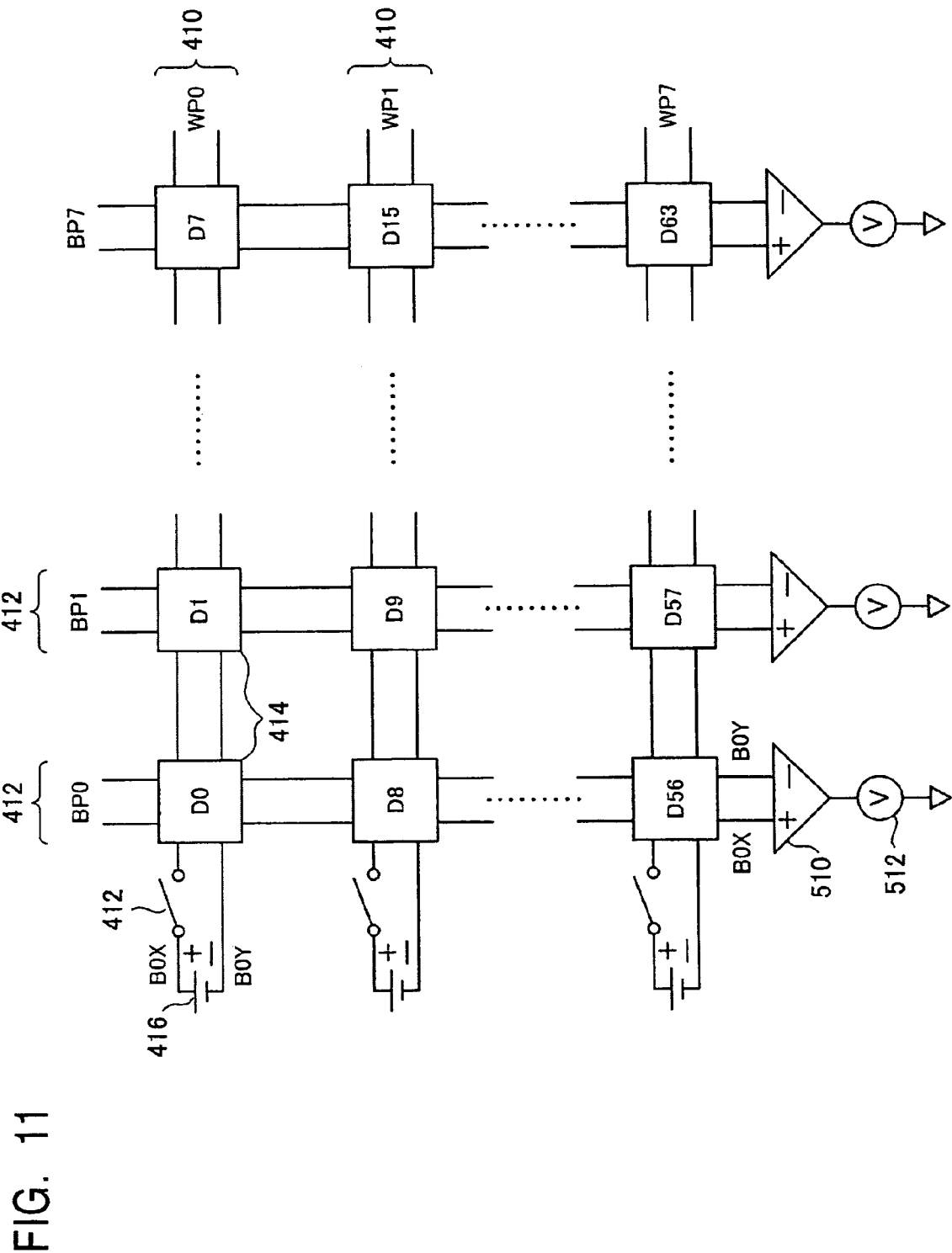
FIG. 11 is a circuit diagram of a semiconductor storage device according to a third embodiment.

FIG. 11 is a circuit diagram of a semiconductor storage device according to a third embodiment. In this case, memory elements, each defining one storage unit in a memory array arranged in a matrix, are each constituted by one resistance portion having a plurality of resistors.

Referring to FIG. 11, operational amplifiers 510 and voltmeters 512 are included in the semiconductor storage device, instead of the ammeters 418.

Two input terminals of each operational amplifier 510 are connected to two bit lines of the corresponding bit line pair 412. The operational amplifier 510 amplifies a small potential difference between the two bit lines and outputs the resulting potential difference. When a voltage across the bit lines is switched over between a positive value and a negative value, the memory elements configuration in the present embodiment allows even a small voltage to be amplified to a value substantially equal to the power-supply voltage of the operational amplifier 510.

The voltmeter 512 measures the voltage amplified by the operational amplifier 510 so that data "1" and "0" are determined.

In this manner, data can be determined without having the configuration including the ammeters 418 shown in FIG. 7. It is also possible to have a configuration including only the voltmeters 512 without the operational amplifiers 510. Additionally, in the present embodiment, a voltage applied for selection of the word line pair 410 can be replaced with electrical current.

Fourth Embodiment

The storage layer, in which the memory elements illustrated in the first to third embodiments are arranged in a matrix, can be configured in conjunction with a peripheral circuit layer, which includes peripheral circuits for controlling the storage layer, so as to have a multilayer structure.

In the memory-element configuration having the transistors, since the peripheral circuits and the transistors are provided in the same semiconductor layer, there is a need to provide the storage layer and the peripheral-circuit layer in separate regions in the same semiconductor layer. In contrast, since the memory-element configuration according to the present embodiment does not require transistors, there is no need to provide memory elements in the semiconductor layer including the peripheral circuits. This arrangement, therefore, makes it possible to overlay the storage layer on the peripheral-circuit layer such that a multilayer structure is provided. As a result, it is possible to provide a compact semiconductor storage device at low cost. Additionally, the configuration of such a multilayer storage layer allows the semiconductor storage device to be integrated into a three-dimension structure, thereby increasing the density.

While the preferred embodiments of the present invention have been described above with reference to the accompanying drawings, the present invention is by no means limited to the illustrated embodiments. Thus, it is apparent to those skilled in the art that various variations and modifications are possible within the scope of the appended claims, and it is to be understood that such variations and medications are encompassed by the spirit and scope of the present invention.

For example, since the above-described advantages can be obtained by the differential operation of the word lines and the bit lines, the 2×2 resistors can be configured with $2^n \times 2^n$ resistors (n is a positive integer). Further, devices for data determination are not limited to the ammeters or voltmeters as long as they can detect the positive or negative value of current and/or a voltage.

What is claimed is:

1. A semiconductor storage device in which data is stored in memory elements arranged in a matrix and the data is readable by address designation, the semiconductor storage device comprising:

a plurality of word line pairs arranged at regular intervals in a row direction, each word line pair being configured as two adjacent word lines;

a plurality of bit line pairs arranged at regular intervals in a column direction so as to intersect the word line pairs, each bit line pair being configured as two adjacent bit lines; and a plurality of resistance portions adapted to serve as the memory elements, each resistance portion being connected across two word lines of the corresponding word line pair and two bit lines of the corresponding bit line pair in a region where the word line pair and the bit line pair intersect each other, each resistance portion including at least one resistor having a resistance corresponding to stored data to define one storage unit.

2. The semiconductor storage device according to claim 1, wherein each resistance portion includes four resistors that are provided across the corresponding intersections of the two word lines of the word line pair and the two bit lines of the bit line pair, one end of each resistor being connected to the corresponding word line and the other end of the resistor being connected to the corresponding bit line, and the data stored in the resistance portion is determined in accordance with combinations of resistances of the four resistors.

3. The semiconductor storage device according to claim 2, wherein, of the four resistors at the intersections of the two word lines and the two bit lines, resistances of two resistors provided at diagonal intersections are substantially equal to each other and resistances of two resistors connected to the same word line are different from each other.

4. The semiconductor storage device according to claim 3, wherein the resistances of the four resistors have predetermined two values, which produce two states for the four resistors, the two states being associated with a pair of data 0 and data 1.

5. The semiconductor storage device according to claim 1, wherein, upon application of a voltage or current across the two word lines of the word line pair, the data is read according to whether current flowing between the two bit lines of the bit line pair is positive or negative.

6. The semiconductor storage device according to claim 1, wherein, upon application of a voltage or current across the two word lines of the word line pair, the data is read according to whether a voltage applied across the two bit lines of the bit line pair is positive or negative.

7. The semiconductor storage device according to claim 1, wherein the resistance portions are provided in the matrix in at least one storage layer, and the storage layer and a peripheral circuit layer, which includes peripheral circuits for controlling the storage layer, are provided as a multilayer structure.

8. The semiconductor storage device according to claim 1, wherein the resistance portions have two ferromagnetic layers and an insulating layer sandwiched therebetween and include tunneling magneto resistive elements, and wherein the tunneling magneto resistive elements have a small resistance when magnetization directions of the two ferromagnetic layers are substantially parallel to each other, and have a large resistance when magnetization directions of the two ferromagnetic layers are not parallel to each other.

* * * * *